(12) United States Patent
Zhang et al.

(10) Patent No.: US 10,719,106 B2
(45) Date of Patent: *Jul. 21, 2020

(54) FACTORY RESET APPARATUS AND METHOD

(71) Applicant: HUAWEI TECHNOLOGIES CO., LTD., Shenzhen (CN)

(72) Inventors: Ruhong Zhang, Shenzhen (CN); Jinbo Ding, Nanjing (CN); Zhengsheng Xie, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/519,018

(22) Filed: Jul. 23, 2019

(65) Prior Publication Data

US 2019/0346896 A1 Nov. 14, 2019

Related U.S. Application Data

(60) Division of application No. 16/013,954, filed on Jun. 21, 2018, now Pat. No. 10,372,180, which is a (Continued)

(30) Foreign Application Priority Data

Dec. 21, 2015 (CN) .......................... 2015 1 0966526

(51) Int. Cl.
  *H03K 3/356* (2006.01)
  *G06F 1/24* (2006.01)
  *G06F 1/26* (2006.01)

(52) U.S. Cl.
  CPC .................. *G06F 1/24* (2013.01); *G06F 1/26* (2013.01); *H03K 3/356* (2013.01)

(58) Field of Classification Search
  CPC .............. G06F 1/24; G06F 1/26; H03K 3/356
  (Continued)

(56) References Cited

U.S. PATENT DOCUMENTS 4,438,357 A * 3/1984 Wicnienski ............... G06F 1/24
  327/143
4,945,300 A * 7/1990 Sato .......................... G06F 1/26
  323/318

(Continued)

FOREIGN PATENT DOCUMENTS

CN 1697319 A 11/2005
CN 102981586 A 3/2013
(Continued)

*Primary Examiner* — John W Poos
(74) *Attorney, Agent, or Firm* — Kilpatrick Townsend & Stockton LLP

(57) ABSTRACT

A factory reset apparatus includes a reset switch, a first power supply module, a flip-flop, and a CPU. The flip-flop includes a data input pin, a clock pin, and a true flip-flop output pin. The reset switch is connected to the data input pin, the first power supply module is connected to the clock pin, and the true flip-flop output pin is connected to the CPU. The reset switch generates a low-level reset signal when being pressed; the flip-flop receives an electrical signal from the clock pin. A rising edge of the electrical signal triggers the flip-flop to latch a low-level state of the reset signal. The flip-flop outputs a low-level reset request signal from the true flip-flop output pin according to the latched low-level state of the reset signal. The CPU starts a factory reset operation according to the reset request signal.

14 Claims, 4 Drawing Sheets

Related U.S. Application Data continuation of application No. PCT/CN2016/090516, filed on Jul. 19, 2016.

(58) Field of Classification Search
USPC .................................... 327/142, 143, 198
See application file for complete search history.

(56) References Cited

U.S. PATENT DOCUMENTS

| | | | |
|---|---|---|---|
| 5,136,253 A * | 8/1992 | Ueno | H03L 7/0891 327/12 |
| 5,832,281 A | 11/1998 | Maeda | |
| 5,847,587 A * | 12/1998 | Chen | G01R 19/16528 327/143 |
| 8,729,936 B2 * | 5/2014 | Wang | H03K 17/20 327/142 |
| 10,372,180 B2 * | 8/2019 | Zhang | G06F 1/26 |
| 2004/0034872 A1 | 2/2004 | Huyge et al. | |
| 2009/0031122 A1 | 1/2009 | Hodzic et al. | |
| 2012/0260076 A1 | 10/2012 | Liu | |
| 2014/0340134 A1 * | 11/2014 | Shionoiri | H03K 3/0375 327/198 |
| 2019/0289156 A1 * | 9/2019 | Watanabe | H04N 1/00901 |

FOREIGN PATENT DOCUMENTS

| | | |
|---|---|---|
| CN | 103164009 A | 6/2013 |
| CN | 203299741 U | 11/2013 |
| CN | 103973287 A | 8/2014 |
| CN | 104113423 A | 10/2014 |
| CN | 104360725 A | 2/2015 |
| JP | S63307516 A | 12/1988 |
| KR | 20020049664 A | 6/2002 |
| KR | 101470247 B1 | 12/2014 |

* cited by examiner

FACTORY RESET APPARATUS AND METHOD

CROSS-REFERENCE TO RELATED APPLICATIONS

This application is a divisional application of U.S. patent application Ser. No. 16/013,954, filed on Jun. 21, 2016, which is a continuation of International Application No. PCT/CN2016/090516, filed on Jul. 19, 2016. The International Application claims priority to Chinese Patent Application No. 201510966526.X, filed on Dec. 21, 2015. All of the aforementioned patent applications are hereby incorporated by reference in their entireties.

TECHNICAL FIELD

This application relates to the communications field, and in particular, to a factory reset apparatus and method.

BACKGROUND

A factory reset function of a communications device is relatively common. When a user makes an incorrect setting or forgets a user name or a password and cannot log in to a device, the user may use a factory reset function, to start the device by using a default factory setting, and then log in to the device by using an initial user name and password. In consideration of factors such as panel space and costs, usually, no dedicated button is used to implement the factory reset function. Instead, a reset (RESET) button is used to assist in implementing the factory reset function. For example, the reset button generates a pressing signal when being pressed, and a complex programmable logical device (CPLD) is used to detect duration of consecutive pressing signals. If the CPLD detects that the duration of the consecutive pressing signals is greater than a preset value, factory reset is performed. If the duration of the consecutive pressing signals is less than a preset value, a system is only reset.

When the factory reset is implemented in this manner, the CPLD or a similar related hardware circuit is required to implement timing and detection functions. Costs of such hardware circuit are relatively high, and software complexity is relatively high. Therefore, production and research and development costs of the communications device are increased.

SUMMARY

Embodiments of this application provide a factory reset apparatus and method, to effectively reduce production costs.

A first aspect of this application provides a factory reset apparatus, where in this application, the factory reset apparatus may be any device, such as a router or a switch, that needs to implement a factory reset function.

The apparatus includes a reset switch, a first power supply module, a flip-flop, and a processor. The flip-flop includes a data input pin, a clock pin, and a true flip-flop output pin.

The reset switch is connected to the data input pin, the first power supply module is connected to the clock pin, and the true flip-flop output pin is connected to a first general purpose input/output pin of the processor.

The reset switch generates a low-level reset signal when being pressed, where the reset signal is input into the flip-flop from the data input pin.

The flip-flop receives an electrical signal from the clock pin, where a rising edge of the electrical signal triggers the flip-flop to latch a low-level state of the reset signal. The first power supply module is a power supply module on a board inside the apparatus. The first power supply module is powered on by an external system direct-current power supply, and generates an original electrical signal when the first power supply module is powered on. The original signal of the electrical signal is generated when the first power supply module is powered on. The electrical signal may be the same as or different from the original signal.

The flip-flop outputs a low-level reset request signal from the true flip-flop output pin according to the latched low-level state of the reset signal.

The processor starts a factory reset operation according to the reset request signal input from the first general purpose input/output pin.

The reset switch and the flip-flop are used to trigger the processor to perform the factory reset operation. The reset switch generates the low-level reset signal when being pressed, the rising edge of the electrical signal generated when the first power supply module inside the apparatus is powered on triggers the flip-flop to latch the low-level state of the reset signal, the flip-flop outputs the low-level reset request signal, and the processor performs the factory reset operation according to the reset request signal. In this way, a circuit that implements a factory reset function is simple, costs of a functional element are low, and production costs of the apparatus are greatly reduced.

Optionally, when there is only one power supply module inside the apparatus, that is, the power supply module is a first power supply module, the first power supply module not only needs to provide, when being powered on, an electrical signal for the flip-flop, but also needs to supply working power to the D flip-flop.

The first power supply module is further connected to a power input pin and a ground pin of the flip-flop, and the first power supply module supplies, after being powered on, working power to the flip-flop.

The factory reset apparatus further includes a delay circuit.

The first power supply module is connected to the clock pin by using the delay circuit, and the original signal that is output by the first power supply module when being powered on passes through the delay circuit and is output as the electrical signal.

An objective of performing delay processing on the original signal is to ensure that the flip-flop has reached a working level when the rising edge of the electrical signal triggers the flip-flop to work, to ensure that triggering of the flip-flop by using the rising edge of the electrical signal works.

An implementation in which the apparatus having only one power supply module on a board inside the apparatus implements a factory reset function is described. Delay processing is performed on the original signal output by the first power supply module, to obtain the electrical signal. The rising edge of the electrical signal triggers the processor to perform the factory reset function. A pertinent solution is provided for function implementation of a type of an apparatus having only one power supply module. Costs of the delay circuit are low, the circuit is simple, and production costs are greatly reduced.

Optionally, when the apparatus includes only one power supply module, because the electrical signal is obtained after delay processing is performed on the original signal by using the delay circuit, and steepness of the rising edge of the electrical signal is decreased, an edge steep circuit may be used to process a signal output by the delay circuit, so that steepness of an electrical signal output by the edge steep circuit is increased, and triggering of the rising edge of the electrical signal is more sensitive.

The factory reset apparatus further includes an edge steep circuit.

The delay circuit is connected to the clock pin by using the edge steep circuit, the original signal that is output by the first power supply module when being powered on passes through the delay circuit and is output as a delay signal, and the delay signal passes through the edge steep circuit and is output as the electrical signal.

The edge steep circuit may increase the steepness of the rising edge of the signal by using a Schmidt inverter. A signal whose edge changes slowly may be changed into a rectangular pulse signal by means of positive feedback of the Schmidt inverter in a status transition process, to increase the steepness of the rising edge.

Optionally, there may be multiple power supply modules on the board inside the apparatus. The multiple power supply modules include a first power supply module and further include a second power supply module. The first power supply module provides an electrical signal for the flip-flop, and the second power supply module may supply working power to the flip-flop.

The second power supply module is powered on earlier than the first power supply module, the second power supply module is connected to a power input pin and a ground pin of the flip-flop, and the second power supply module supplies, after being powered on, working power to the flip-flop.

The first power supply module outputs the electrical signal when being powered on.

The factory reset apparatus may be any device, such as a router or a switch, that needs to implement a factory reset function. A quantity of power supply modules on a board of each factory reset apparatus is different. In this embodiment of this application, an implementation in which the apparatus having multiple power supply modules implements a factory reset function is described, to provide pertinent solutions for factory reset function implementation of different types of devices. A circuit is simple, costs of a functional element are low, and production costs of the apparatus are greatly reduced.

Optionally, the flip-flop further includes a preset pin, and the preset pin is connected to a second general purpose input/output pin of the processor.

After the processor starts the factory reset operation according to the reset request signal, the processor outputs a reset control signal by using the second general purpose input/output pin. The reset control signal is a low-level signal, and the low-level reset control signal is input into the flip-flop from the preset pin, so that a high-level signal is output from the true flip-flop output pin of the flip-flop.

The flip-flop performs a reset operation according to the reset control signal.

Optionally, the flip-flop determines, according to the reset control signal input by the processor into the preset pin, that the second general purpose input/output pin is in a high-impedance state. This indicates that the apparatus performs a reset operation, and the flip-flop pulls a level of the preset pin up to a power supply level by using a pull-up resistor, so that a status of the flip-flop is not affected by reset of the apparatus.

A second aspect of this application provides a factory reset method, where the method is applied to the foregoing factory reset apparatus, and the method includes:

generating, by a reset switch, a low-level reset signal when being pressed, where the reset signal is input into a flip-flop from a data input pin;

receiving, by the flip-flop, an electrical signal from a clock pin, where a rising edge of the electrical signal triggers the flip-flop to latch a low-level state of the reset signal;

outputting, by the flip-flop, a low-level reset request signal from a true flip-flop output pin according to the latched low-level state of the reset signal; and starting, by a processor, a factory reset operation according to the reset request signal input from a first general purpose input/output pin.

The reset switch and the flip-flop are used to trigger the processor to perform the factory reset operation. The reset switch generates the low-level reset signal when being pressed, the rising edge of the electrical signal generated when the first power supply module inside the apparatus is powered on triggers the flip-flop to latch the low-level state of the reset signal, the flip-flop outputs the low-level reset request signal, and the processor performs the factory reset operation according to the reset request signal. In this way, a circuit that implements a factory reset function is simple, costs of a functional element are low, and production costs of the apparatus are greatly reduced.

Optionally, the apparatus may be any device, such as a router or a switch, that needs to implement a factory reset function. Therefore, there may be different quantities of power supply modules inside different devices. For example, there may be only one power supply module on a board inside a device; and the power supply module not only needs to provide, when being powered on, an electrical signal for the flip-flop, but also needs to supply working power to the flip-flop.

The factory reset apparatus further includes a delay circuit, the first power supply module is connected to the clock pin by using the delay circuit, and the first power supply module is further connected to a power input pin and a ground pin of the flip-flop, and before the receiving, by the flip-flop, an electrical signal from a clock pin, the method further includes:

supplying, by the first power supply module after being powered on, working power to the flip-flop by using the power input pin and the ground pin of the flip-flop, and outputting, by the first power supply module when being powered on, an original signal to the delay circuit, where the original signal passes through the delay circuit and is output as the electrical signal.

An objective of performing delay processing on the electrical signal is to ensure that the rising edge of the electrical signal triggers the flip-flop to work after the flip-flop has reached a working level of the flip-flop, to ensure that an action of triggering the flip-flop by using the rising edge of the electrical signal works.

Optionally, the factory reset apparatus further includes an edge steep circuit. Before the receiving, by the flip-flop, an electrical signal from a clock pin, the method further includes: outputting a delay signal to the edge steep circuit after the delay circuit processes the original signal, where the original signal passes through the edge steep circuit and is output as the electrical signal.

Because the electrical signal is obtained after delay processing is performed on the original signal, the rising edge of the electrical signal is slow (i.e. steepness of the rising edge of the electrical signal is small), and the edge steep circuit may be used to process a second signal, so that steepness of a rising edge of the second signal is increased, and triggering of the rising edge of the electrical signal is more sensitive.

Optionally, there may be multiple power supply modules on a board inside a device. The multiple power supply modules include a first power supply module and a second power supply module. The first power supply module provides an electrical signal for the flip-flop, the second power supply module may supply working power to the flip-flop, and the second power supply module is connected to a power input pin and a ground pin of the flip-flop.

The second power supply module is powered on earlier than the first power supply module, and before the receiving, by the flip-flop, the electrical signal from a clock pin, the method further includes:

supplying, by the second power supply module after being powered on, working power to the flip-flop, and outputting, by the first power supply module, the electrical signal when being powered on.

An implementation in which the apparatus having multiple power supply modules implements a factory reset function is described, to provide pertinent solutions for factory reset function implementation of different types of devices. A circuit is simple, costs of a functional element are low, and production costs of the apparatus are greatly reduced.

Optionally, the flip-flop further includes a preset pin, and the preset pin is connected to a second general purpose input/output pin of the processor.

After the processor starts the factory reset operation according to the reset request signal, the processor outputs a reset control signal by using the second general purpose input/output pin. The reset control signal is a low-level signal, and the low-level reset control signal is input into the flip-flop from the preset pin, so that a high-level signal is output from the true flip-flop output pin of the flip-flop. The flip-flop performs a reset operation according to the reset control signal.

Optionally, the method further includes: determining, by the flip-flop according to the reset control signal input by the processor into the preset pin, that the second general purpose input/output pin is in a high-impedance state. This indicates that the apparatus performs a reset operation, and the flip-flop pulls a level of the preset pin up to a power supply level by using a pull-up resistor, so that a status of the flip-flop is not affected by reset of the apparatus.

It can be learned from the foregoing technical solutions that the embodiments of this application have the following advantages:

In the embodiments of this application, the reset switch is connected to the flip-flop, the reset switch generates a low-level pressing signal when being pressed, and the pressing signal is transmitted to the flip-flop from the data input pin. A power supply module inside the factory reset apparatus is connected to the flip-flop, and the rising edge of the electrical signal that is generated by the power supply module when being powered on triggers the flip-flop to latch the low-level state of the pressing signal, so that the flip-flop outputs the low-level reset request signal to the processor, and the processor performs the factory reset operation according to the low-level reset request signal. In the embodiments of this application, a circuit that implements a factory reset function is simple. This greatly reduces costs, and the factory reset apparatus designed with low costs can implement the factory reset function.

DESCRIPTION OF EMBODIMENTS

To make persons skilled in the art understand the technical solutions in this application better, the following clearly describes the technical solutions in the embodiments of this application with reference to the accompanying drawings in the embodiments of this application. Apparently, the described embodiments are merely some rather than all of the embodiments of this application. All other embodiments obtained by persons of ordinary skill in the art based on the embodiments of this application without undue experiment shall fall within the protection scope of this application.

In the specification, claims, and accompanying drawings of this application, the terms "first", "second", "third", "fourth", and the like (if existent) are intended to distinguish between similar objects but do not necessarily indicate a specific order or sequence. It should be understood that data termed in such a way is interchangeable in proper circumstances, so that the embodiments described herein can be implemented in other orders than the order illustrated or described herein. Moreover, the terms "include", "contain", and any other variants mean to cover the non-exclusive inclusion, for example, a process, method, system, product, or device that includes a list of steps or units is not necessarily limited to those steps or units, but may include other steps or units not expressly listed or inherent to the process, method, product, or device.

In some embodiments of this application, a reset switch and a flip-flop are used to trigger a processor to perform a factory reset operation. The flip-flop may be a D flip-flop. The D flip-flop is used as an example for description in the embodiments. The reset switch generates a low-level reset signal when being pressed, a rising edge of an electrical signal (Power Good signal) generated when a power supply module inside a factory reset apparatus is powered on triggers the D flip-flop to latch a low-level state of the reset signal, the D flip-flop outputs a low-level reset request signal, and the processor performs the factory reset operation according to the reset request signal. In the embodiments of this application, the factory reset apparatus may be any device, such as a router or a switch, that needs to implement a factory reset function.

For ease of understanding, the following describes a specific procedure in the embodiments of this application.

Figure 1:
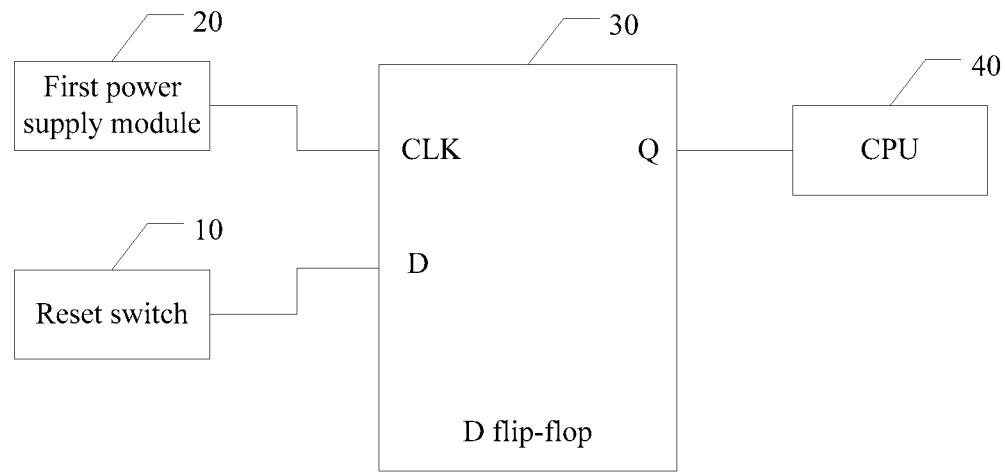
FIG. 1 is a schematic diagram of an embodiment of a factory reset apparatus according to embodiments of this application.

Referring to FIG. 1, an embodiment of a factory reset apparatus according to the embodiments of this application includes:

a factory reset apparatus, including a reset switch 10, a first power supply module 20, a D flip-flop 30, and a processor 40, where the D flip-flop 30 includes a data input (symbol: D) pin, a clock (symbol: CLK) pin, and a true flip-flop output (symbol: Q) pin; the reset switch 10 is connected to the D pin, the first power supply module 20 is connected to the CLK pin, and the Q pin is connected to a first general purpose input/output (GPIO) pin of the processor 40.

The processor 40 may be a central processing unit (CPU) or a network processor (NP). Then, an example in which the processor 40 is the CPU (shown in the figure) is used to describe the technical solutions in the embodiments of this application, and is not construed as a limitation on the protection scope of this application.

A low-level reset signal is generated when the reset switch 10 is pressed, and a high-level reset signal is generated when the reset switch 10 is not pressed. The reset signal is input into the D flip-flop 30 from the D pin.

In this embodiment, a function of the first power supply module 20 is to provide an electrical signal for the D flip-flop 30 when the first power supply module 20 is powered on. The D flip-flop 30 receives the electrical signal from the CLK pin. A rising edge of the electrical signal triggers the D flip-flop 30 to latch a level state of the reset signal.

It may be understood that the rising edge means that a low level of the electrical signal is changed to a high level. The low level of the electrical signal is changed to the high level, to trigger the D flip-flop 30 to work.

The D flip-flop 30 outputs a reset request signal from the Q pin according to the latched level state of the reset signal. A level state of the reset request signal is the same as the level state of the reset signal.

The CPU 40 receives the reset request signal by using the first GPIO pin. The CPU 40 determines the level state of the reset request signal. If the level state of the reset request signal is low-level, the CPU 40 performs a factory reset operation according to the low-level reset request signal.

For specific implementation of the D flip-flop 30, refer to a truth table of the D flip-flop 30, as shown in Table 1:

TABLE 1

| Input | | Output |
|---|---|---|
| D | CLK | Q |
| L | ⌐ | L |
| H | ⌐ | H |

Notes:
In Table 1 above, "L" represents a low level, "H" represents a high level, and "⌐" represents a rising edge of a signal.

It may be understood that a specific application scenario of the factory reset apparatus is as follows:

When the factory reset apparatus needs to perform factory reset, the reset switch 10 needs to be pressed before the first power supply module 20 is powered on. Then, the first power supply module 20 is powered on, and the reset switch 10 generates the low-level reset signal. After the first power supply module 20 is powered on, the reset switch 10 gets bumped. Whether the power supply module has already been powered on may be determined according to an external indicator of the apparatus, an alert sound of the apparatus, or another method. This is not limited herein.

The first power supply module outputs the electrical signal when being powered on. The rising edge of the electrical signal triggers the D flip-flop 30 to latch the low-level state of the reset signal, and the D flip-flop 30 outputs the low-level reset request signal and transmits the reset request signal to the CPU 40. The CPU 40 performs the factory reset operation according to the reset request signal.

It should be noted that the first power supply module 20 in the embodiment of this application is a power supply module on a board inside the apparatus. An external power supply (a system direct-current power supply) of the apparatus powers on the first power supply module 20 inside the apparatus, may be understood that the external power supply may be an alternating-current-to-direct-current converter, the alternating-current-to-direct-current converter outputs a system direct-current power supply, and the system direct-current power supply supplies direct-current power to the first power supply module 20, so that the first power supply module 20 inside the apparatus is powered on.

In this embodiment, the reset switch 10 and the D flip-flop 30 are used to trigger the CPU 40 to perform the factory reset operation. The reset switch 10 generates the low-level reset signal when being pressed, the rising edge of the electrical signal generated when the first power supply module 20 inside the apparatus is powered on triggers the D flip-flop 30 to latch the low-level state of the reset signal, the D flip-flop 30 outputs the low-level reset request signal, and the CPU 40 performs the factory reset operation according to the reset request signal. In this embodiment of this application, a circuit that implements a factory reset function is simple, costs of a functional element are low, and production costs of the factory reset apparatus are greatly reduced.

It should be noted that the apparatus may be any device, such as a router or a switch, that needs to implement a factory reset function. Therefore, there may be different quantities of power supply modules inside different devices. For example, there may be only one power supply module on a board inside a device; and the power supply module not only needs to provide, when being powered on, an electrical signal for the D flip-flop, but also needs to supply working power to the D flip-flop.

There may be multiple power supply modules on a board inside a device. The multiple power supply modules include a first power supply module and a second power supply module. The first power supply module provides an electrical signal for the D flip-flop, and the second power supply module may supply working power to the D flip-flop. Different circuit solutions are designed according to different quantities of power supply modules inside the apparatus. Descriptions are separately provided in the following:

1. The Apparatus Includes a First Power Supply Module and a Second Power Supply Module.

First, an example in which the apparatus includes only a first power supply module 20 and a second power supply module 70 is used for description.

Figure 2:
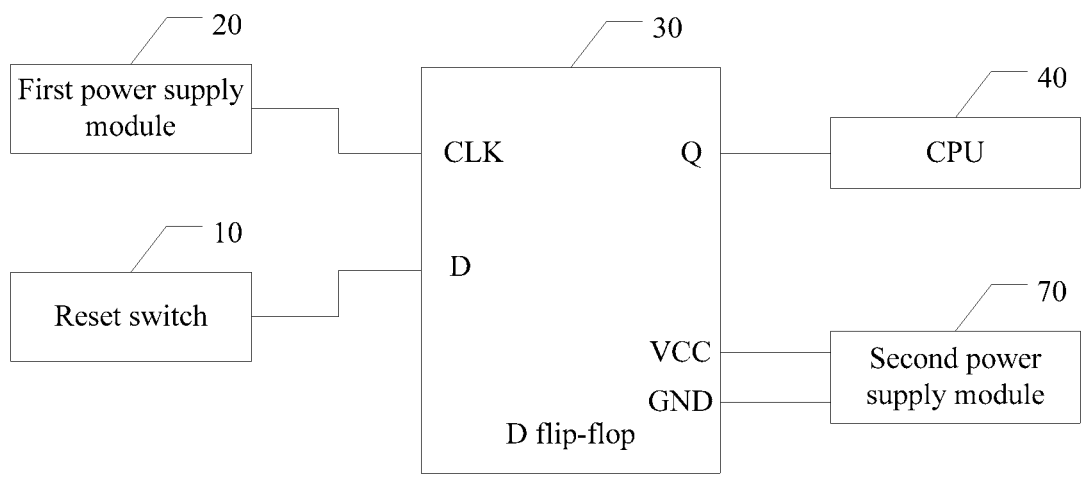
FIG. 2 is a schematic diagram of another embodiment of a factory reset apparatus according to embodiments of this application.

Referring to FIG. 2, another embodiment of a factory reset apparatus according to the embodiments of this application includes:

a factory reset apparatus, including a reset switch 10, a first power supply module 20, a second power supply module 70, a D flip-flop 30, and a central processing unit CPU 40, where the D flip-flop 30 includes a data input D pin, a clock CLK pin, and a true flip-flop output Q pin.

The reset switch 10 is connected to the D pin of the D flip-flop, and the Q pin is connected to a first GPIO pin of the CPU 40. A PG (Power Good) pin of the first power supply module 20 is connected to the CLK pin of the D flip-flop. The second power supply module 70 is connected to the D flip-flop 30. The D flip-flop 30 includes a power input (English: voltage circuit, VCC for short) pin and a ground GND) pin. A positive electrode of the second power supply module 70 is connected to the VCC pin of the D flip-flop, a negative electrode of the second power supply module 70 is connected to the GND pin of the D flip-flop, and the second power supply module 70 supplies working power to the D flip-flop 30.

Both the first power supply module 20 and the second power supply module 70 are connected to an external system direct-current power supply of the apparatus. After the system direct-current power supply is powered on and works, the first power supply module 20 and the second power supply module 70 are powered on. A sequence of powering on the first power supply module 20 and the second power supply module 70 is that the second power supply module 70 is first powered on and then the first power supply module 20 is powered on.

It should be noted that the system is powered on and works when a level output value of the system direct-current power supply reaches a preset value. For example, an alternating-current-to-direct-current converter needs to convert a 220-volt alternating current to a 12-volt direct current. When a voltage output by the system direct-current power supply reaches direct-current 12 volts, it indicates that the system direct-current power supply is powered on and works.

The reset switch 10 generates a low-level reset signal when being pressed. The reset signal is input into the D flip-flop 30 from the D pin.

After being powered on, the second power supply module 70 supplies effective working power to the D flip-flop 30, so that the D flip-flop 30 enters a working state.

The first power supply module 20 generates an electrical signal when being powered on. The electrical signal is output to the CLK pin of the D flip-flop 30 from the PG pin of the first power supply module 20. A rising edge of the electrical signal triggers the D flip-flop 30 that has entered the working state to latch a low-level state of the reset signal.

The D flip-flop 30 outputs a low-level reset request signal from the Q pin according to the latched low-level state of the reset signal. The CPU 40 starts a factory reset operation according to the reset request signal input from the first GPIO pin.

Then, an example in which the apparatus includes multiple power supply modules is used for description.

Figure 3:
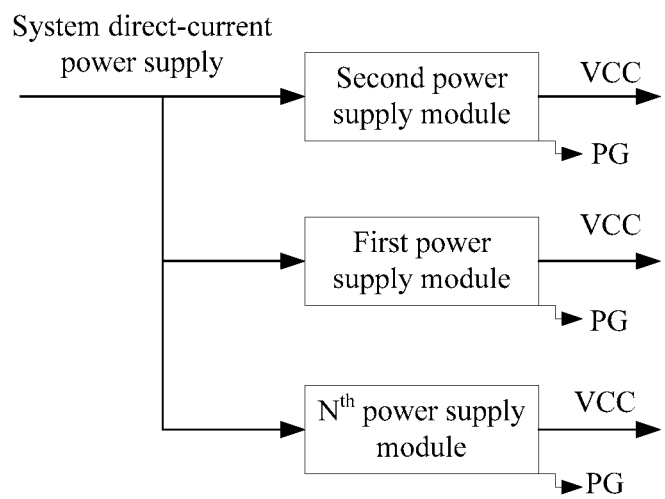
FIG. 3 is a schematic diagram of powering on a power supply module according to an embodiment of this application.

Referring to FIG. 3, FIG. 3 is a schematic diagram of powering on multiple power supply modules.

The power supply modules include a first power supply module 20, a second power supply module 70, . . . , and an $N^{th}$ power supply module (N is a natural number, and a quantity of power supply modules is equal to N). It should be noted that principles of the multiple power supply modules included on a board inside the apparatus are the same as principles of two power supply modules that are included. The first power supply module 20 and the second power supply module 70 that are described above may be any two power supply modules of the N power supply modules. After the system direct-current power supply is powered on and works, the first power supply module 20, the second power supply module 70, . . . , and the $N^{th}$ power supply module are powered on. It should be noted that the second power supply module 70 is a module powered on earlier than the first power supply module 20, that is, the second power supply module 70 is powered on earlier than the first power supply module 20, so that the second power supply module 70 supplies effective working power to the D flip-flop 30. The working power being effective means that a value of a voltage output by the second power supply module 70 reaches a preset value of a working voltage of the D flip-flop 30. The first power supply module 20 provides, when being powered on, an electrical signal for the D flip-flop. A rising edge of the electrical signal triggers the D flip-flop to latch the low-level state of the reset signal. For example, if the fourth powered-on power supply module is used as the first power supply module (which is a power supply module that provides an electrical signal for the D flip-flop), any power supply module of the first powered-on power supply module, the second powered-on power supply module, or the third powered-on power supply module may be used as the second power supply module (which is a module that supplies working power to the D flip-flop). Working principles of the first power supply module 20 and the second power supply module 70 are the same as principles of the only two power supply modules included in the apparatus, and details are not repeated herein.

For an implementation of the D flip-flop 30, refer to a truth table of the D flip-flop 30, as shown in Table 1.

It may also be understood that a moment at which the second power supply module 70 is powered on is earlier than a moment at which the first power supply module 20 is powered on. The second power supply module 70 and the first power supply module 20 herein are not particularly the first powered-on power supply module and the second powered-on power supply module, but any two sequentially powered-on power supply modules.

No limitation is imposed on a specific quantity of power supply modules in this embodiment.

In this embodiment, the reset switch 10 and the D flip-flop 30 are used to trigger the CPU 40 to perform the factory reset operation. The reset switch 10 generates the low-level reset signal when being pressed, a rising edge of an electrical signal generated when a power supply module inside the apparatus is powered on triggers the D flip-flop 30 to latch the low-level state of the reset signal, the D flip-flop 30 outputs the low-level reset request signal, and the CPU 40 performs the factory reset operation according to the reset request signal.

The factory reset apparatus in this embodiment may be any device, such as a router or a switch, that needs to implement a factory reset function. A quantity of power supply modules on a board of each factory reset apparatus is different. In this embodiment of this application, an implementation in which the apparatus having multiple power supply modules implements a factory reset function is described, to provide pertinent solutions for factory reset function implementation of different types of devices. A circuit is simple, costs of a functional element are low, and production costs of the apparatus are greatly reduced.

2. There is Only One Power Supply Module Inside the Apparatus.

Figure 4:
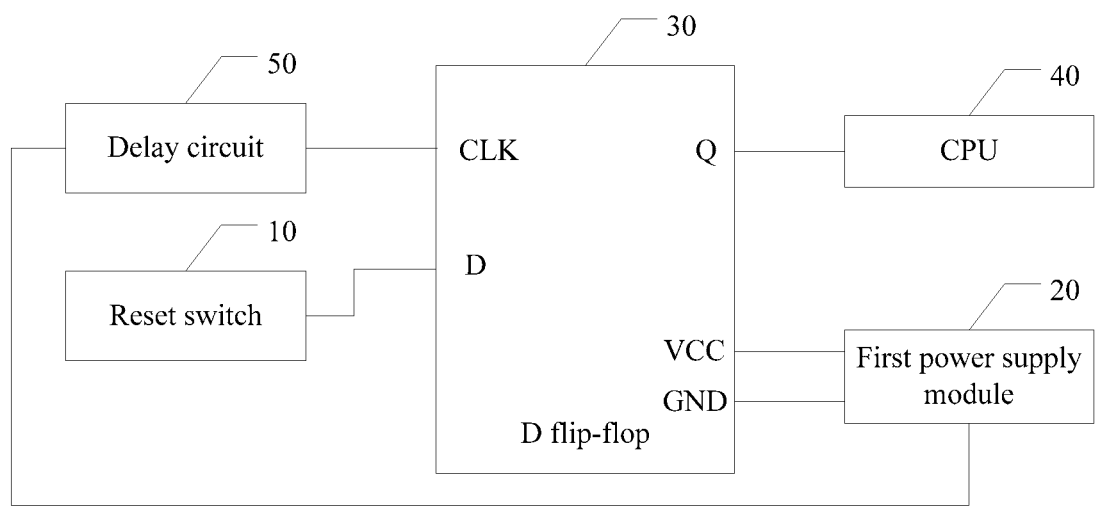
FIG. 4 is a schematic diagram of another embodiment of a factory reset apparatus according to embodiments of this application.

As shown in FIG. 4, another embodiment of a factory reset apparatus for factory reset according to the embodiments of this application includes:

a factory reset apparatus, including a reset switch 10, a first power supply module 20, a D flip-flop 30, CPU 40, and a delay circuit 50, where the D flip-flop 30 includes a data input D pin, a clock CLK pin, and a true flip-flop output Q pin.

The reset switch 10 is connected to the D pin of the D flip-flop, the first power supply module 20 is connected to the CLK pin of the D flip-flop, and the Q pin of the D flip-flop is connected to a first GPIO pin of the CPU 40. A positive electrode of the first power supply module 20 is connected to a VCC pin of the D flip-flop 30, a negative electrode of the first power supply module 20 is connected to a GND pin of the D flip-flop 30, a PG pin of the first power supply module 20 is connected to an input end of the delay circuit 50, and an output end of the delay circuit 50 is connected to the CLK pin.

The reset switch 10 generates a low-level reset signal when being pressed. The reset signal is input into the D flip-flop 30 from the D pin.

The first power supply module 20 generates an original signal when being powered on. The original signal is transmitted to the delay circuit 50 from the PG pin of the first power supply module 20.

The delay circuit 50 performs delay processing on the original signal, and outputs an electrical signal from an output end of the delay circuit 50. The electrical signal is input into the CLK pin of the D flip-flop 30, and a rising edge of the electrical signal triggers the D flip-flop 30 to latch a low-level state of the reset signal. For specific implementation of the D flip-flop 30, refer to a truth table of the D flip-flop 30, as shown in Table 1.

An objective of performing delay processing on the original signal is to ensure that the rising edge of the electrical signal triggers the D flip-flop 30 to work after the D flip-flop 30 has reached a working level of the D flip-flop.

The D flip-flop 30 outputs a low-level reset request signal from the Q pin of the D flip-flop according to the latched low-level state of the reset signal. The CPU 40 starts a factory reset operation according to the reset request signal input from the first GPIO pin.

Figure 5:
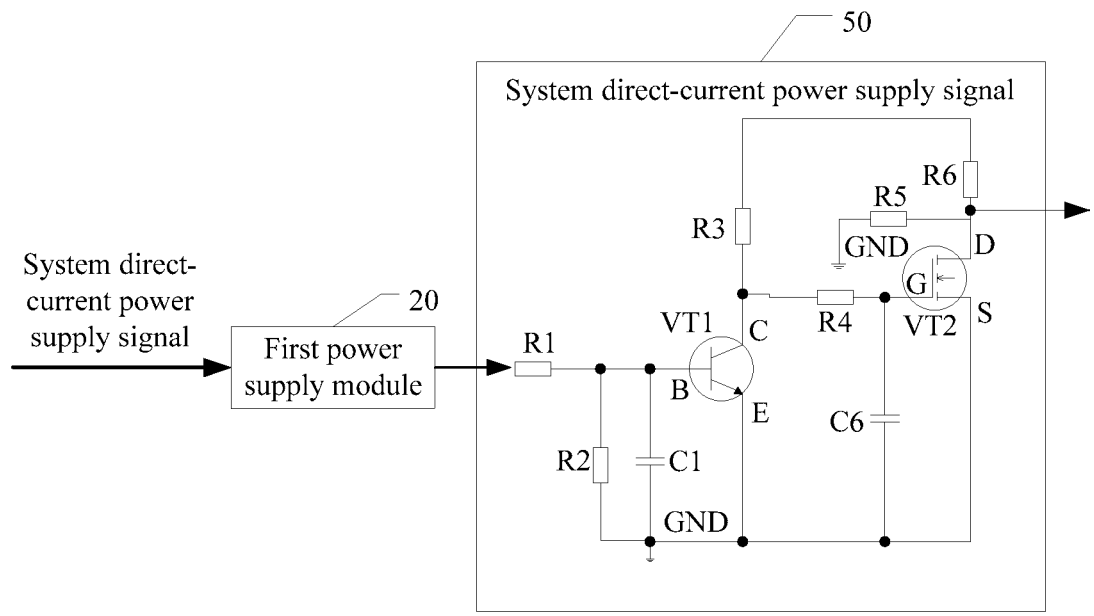
FIG. 5 is a schematic diagram of a delay circuit of another embodiment of a factory reset apparatus according to embodiments of this application.

The delay circuit 50 has many implementations, provided that a delay function is exerted on a signal. No limitation is imposed herein on a specific connection manner of components in the circuit. Only an example is used for description in this embodiment, as shown in FIG. 5.

The delay circuit 50 includes a first resistor R1, a second resistor R2, a third resistor R3, a fourth resistor R4, a fifth resistor R5, a sixth resistor R6, a first capacitor C1, a sixth capacitor C6, a vacuum triode (English: Vacuum Triode, Symbol: VT), and a MOS (Metal-Oxide-Semiconductor,) transistor. The vacuum triode is corresponding to a VT1 in FIG. 5, the MOS transistor is corresponding to a VT2 in FIG. 5, the MOS transistor may be an N-channel MOS transistor, and the vacuum triode may be an NPN triode.

The vacuum triode VT1 includes a base (symbol: B), an emitter (symbol: E), and a collector (symbol: C).

The MOS transistor VT2 includes a gate (symbol: G), a source (symbol: S), and a drain (symbol: D).

An end of R1 is connected to the first power supply module 20, and another end of R1 is connected to R2. R2 is connected in parallel to C1. An end of C1 is connected to B of VT1, another end of C1 is connected to E of VT1, and C of VT1 is connected to an end of R3. Both another end of R3 and an end of R6 are connected to a system direct-current power supply. Another end of R6 is connected to an end of R5 and connected to D of VT2. G of VT2 is connected to an end of C6, and S of VT2 is connected to another end of C6 and connected to an end of R4. Another end of R4 is connected between the another end of R3 and G of VT1.

A basic principle of the delay circuit 50 is as follows:

The system direct-current power supply generates a system direct-current power signal. The system direct-current power signal passes through R6 and reaches VT2, to conduct D/S of VT2. The original signal that is generated by the first power supply module 20 when being powered on passes through R1, to charge C1, and charging of C1 is completed after a time t. After C1 becomes high-level, C and E of VT1 are conducted, and C of VT1 changes from high-level to low-level, so that G of VT2 changes from high-level to low-level, conduction of the D/S of VT2 changes to disconnection, and D of VT2 changes from low-level to high-level. Then, the electrical signal is output. The electrical signal is a signal obtained by delaying the original signal.

Optionally, because the electrical signal is obtained after delay processing is performed on the original signal, the rising edge of the electrical signal is slow, and an edge steep circuit 60 may be used to process a second signal, so that steepness of a rising edge of the second signal is increased.

Figure 6:
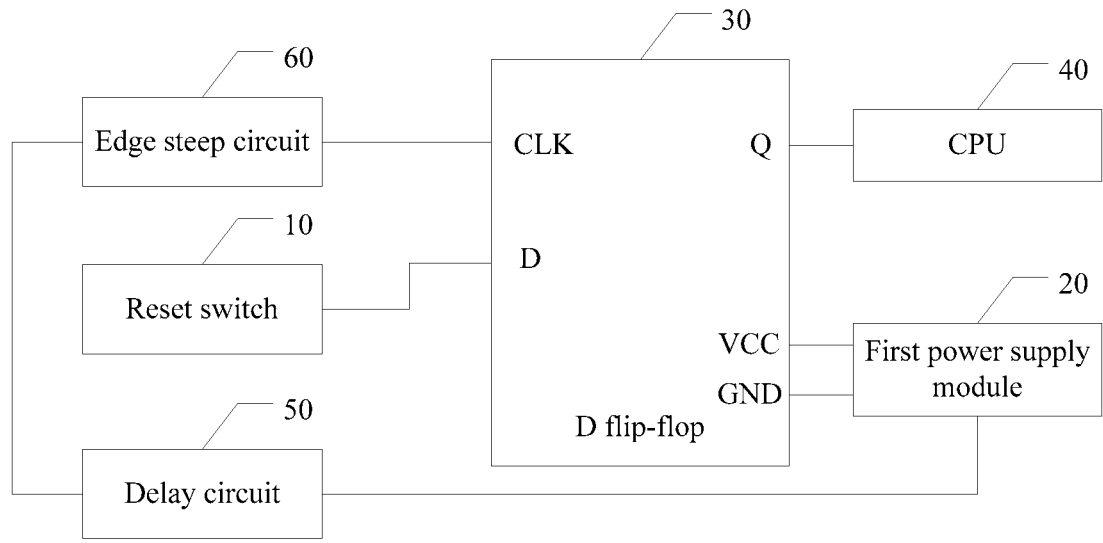
FIG. 6 is a schematic diagram of another embodiment of a factory reset apparatus according to embodiments of this application.

Further, as shown in FIG. 6, another embodiment provided in the embodiments of this application includes:

a factory reset apparatus, including a reset switch 10, a first power supply module 20, a D flip-flop 30, CPU 40, and a delay circuit 50, where the D flip-flop 30 includes a data input D pin, a clock CLK pin, and a true flip-flop output Q pin.

The reset switch 10 is connected to the D pin of the D flip-flop, the first power supply module 20 is connected to the CLK pin of the D flip-flop, and the Q pin of the D flip-flop is connected to a first GPIO pin of the CPU 40. A positive electrode of the first power supply module 20 is connected to a VCC pin of the D flip-flop 30, a negative electrode of the first power supply module 20 is connected to a GND pin of the D flip-flop 30, a PG pin of the first power supply module 20 is connected to an input end of the delay circuit 50, and an output end of the delay circuit 50 is connected to the CLK pin.

The reset switch 10 generates a low-level reset signal when being pressed. The reset signal is input into the D flip-flop 30 from the D pin.

The first power supply module 20 generates an original signal when being powered on. The original signal is transmitted to the delay circuit 50 from the PG pin of the first power supply module 20.

The delay circuit 50 performs delay processing on the original signal. A signal output from an output end of the delay circuit 50 passes through an edge steep circuit 60 and is output as an electrical signal, and a rising edge, whose steepness is increased, of the electrical signal triggers the D flip-flop 30 to latch a low-level state of the reset signal.

Figure 7:
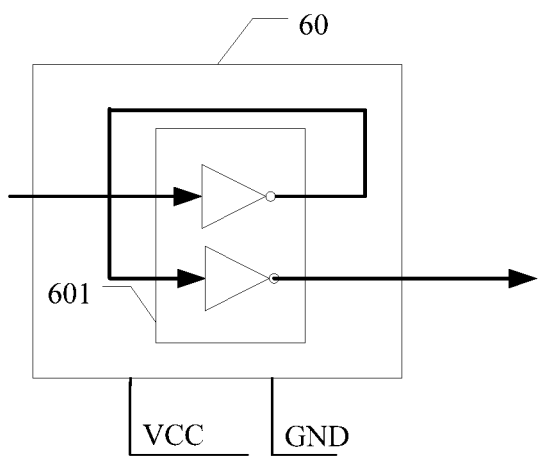
FIG. 7 is a schematic diagram of an edge steep circuit of another embodiment of a factory reset apparatus according to embodiments of this application.

It should be noted that the edge steep circuit is shown in FIG. 7, and the edge steep circuit 60 may increase the steepness of the rising edge of the signal by using a Schmidt inverter 601. A signal whose edge changes slowly may be changed into a rectangular pulse signal by means of positive feedback of the Schmidt inverter 601 in a status transition process, to increase the steepness of the rising edge.

The D flip-flop 30 outputs a low-level reset request signal from the Q pin of the D flip-flop according to the latched low-level state of the reset signal. The CPU 40 starts a factory reset operation according to the reset request signal input from the first GPIO pin.

In this embodiment, the reset switch 10 and the D flip-flop 30 are used to trigger the CPU 40 to perform the factory reset operation. The reset switch 10 generates the low-level reset signal when being pressed, the rising edge of the electrical signal generated when the first power supply module 20 inside the factory reset apparatus is powered on triggers the D flip-flop 30 to latch the low-level state of the reset signal, the D flip-flop 30 outputs the low-level reset request signal, and the CPU 40 performs the factory reset operation according to the reset request signal.

In this embodiment of this application, an implementation in which a device having only one power supply module on a board inside the apparatus implements a factory reset function is described. Delay processing and steep processing are performed on the original signal output by the first power supply module 20, to obtain the electrical signal. The rising edge of the electrical signal triggers the CPU 40 to perform the factory reset function, so that the factory reset function is well implemented and pertinent solutions are provided for factory reset function implementation of different types of apparatuses. Costs of the delay circuit 50 and the edge steep circuit 60 are low, the circuits are simple, and production costs of the apparatus are greatly reduced.

Figure 8:
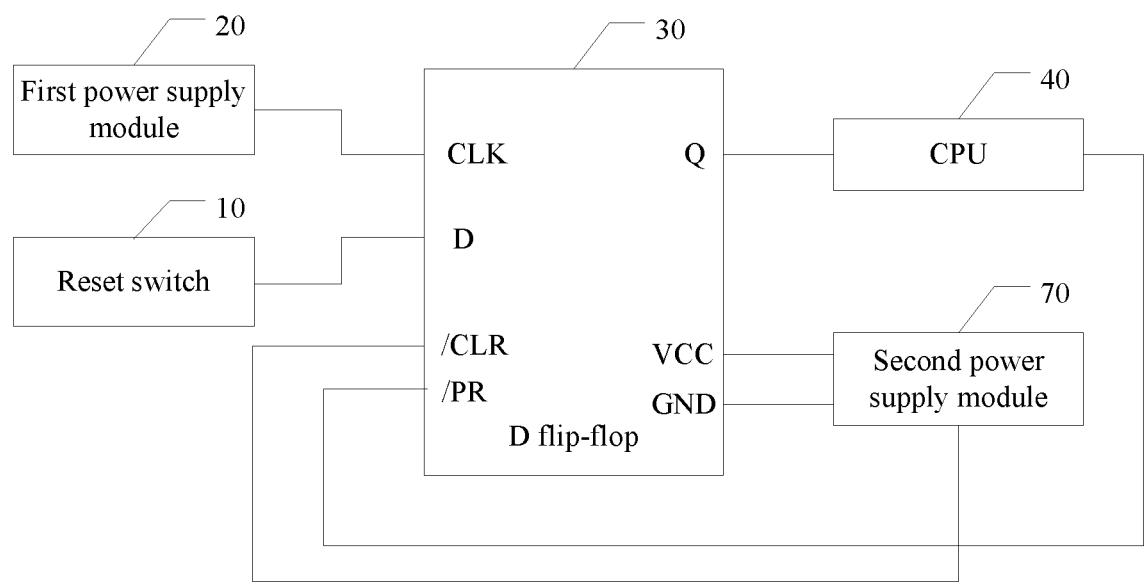
FIG. 8 is a schematic diagram of another embodiment of a factory reset apparatus according to embodiments of this application.

Based on the foregoing embodiments, after the CPU 40 completes the factory reset operation according to the reset request signal input from the first GPIO pin, the CPU 40 is further configured to implement a reset operation of the D flip-flop 30. Referring to FIG. 8, another embodiment of a factory reset apparatus according to the embodiments of this application includes:

a factory reset apparatus, including: a reset switch 10, a first power supply module 20, a second power supply module 70, a D flip-flop 30, and CPU 40, where the D flip-flop 30 includes a data input D pin, a clock CLK pin, a preset (English: preset, symbol: /PR) pin, a clear (English: clear, symbol: /CLR) pin, and a Q pin.

It should be noted that there may be one or more power supply modules in this embodiment. Two power supply modules are used as an example for description in this embodiment, but are not construed as a limitation.

The reset switch 10 is connected to the D pin of the D flip-flop 30, the first power supply module 20 is connected to the CLK pin of the D flip-flop 30, the Q pin of the D flip-flop 30 is connected to a first GPIO pin of the CPU 40, the/PR pin of the D flip-flop 30 is connected to a second GPIO pin of the CPU 40, and the/CLR pin of the D flip-flop 30 is connected to the first power supply module 20.

After the CPU 40 starts a factory reset operation according to the reset request signal, the CPU 40 outputs a low-level reset control signal by using the second GPIO pin. The low-level reset control signal is input into the D flip-flop 30 from the preset/PR pin of the D flip-flop. A level of the clear/CLR pin is the same as a level of a VCC pin of the D flip-flop 30, that is, a high level.

The D flip-flop 30 performs a reset operation according to the reset control signal.

For implementation of the D flip-flop 30, refer to a truth table of the D flip-flop 30, as shown in Table 2.

TABLE 2

| Input | | | | Output | |
|---|---|---|---|---|---|
| /CLR | /PR | D | CLK | Q | Function |
| H | L | x | x | H | Reset |

Notes:
In Table 2, "H" represents a high level, "L" represents a low level, and "x" represents no concern.

It can be learned from Table 2 that a high-level signal is input to the clear/CLR pin of the D flip-flop 30, a low-level signal is input to the/PR pin of the D flip-flop 30, and the high-level signal is output from the Q pin. It may be understood that the CPU 40 sends the low-level reset control signal, and the high-level signal, instead of the low-level signal, is output from the Q pin of the D flip-flop 30, that is, the D flip-flop 30 no longer triggers the CPU 40 to perform the factory reset operation.

Further, after performing the factory reset operation, the CPU 40 inputs the low-level reset control signal into the/PR pin of the D flip-flop 30 to reset the D flip-flop 30, so that the high-level signal is output from the Q pin of the D flip-flop 30. If reset occurs in the apparatus, when the apparatus is reset, the second GPIO pin of the CPU may be in a high-impedance state. A level state of the second GPIO pin is undetermined, and a level of the/PR pin connected to the second GPIO pin is also undetermined. The D flip-flop 30 determines, according to the signal input by the CPU 40 into the/PR pin, that the second GPIO pin is in the high-impedance state, and the D flip-flop 30 pulls the level of the/PR pin up to a power supply level, that is, a level of the VCC, by using a pull-up resistor, that is, the undetermined level state of the/PR pin of the D flip-flop 30 remains in a high-level state, to ensure that a status of the D flip-flop 30 is not affected by the reset of the apparatus.

It should be noted that, in this application, a manner of how to trigger the CPU 40 to perform a particular function is described, that is, a signal that is generated when a power supply module inside a device is powered on triggers the D flip-flop 30, to ensure that the D flip-flop 30 latches a level state of the reset signal of the reset switch 10, to implement the particular function. The particular function of the factory reset apparatus is not limited to a factory reset function. Any manner in which the CPU 40 is triggered to implement the particular function and a triggering condition is the same as the essence of this solution falls within the protection scope of this application.

The foregoing describes the factory reset apparatus. The following describes a factory reset method. The method is applied to the factory reset apparatus. This application provides an embodiment of the factory reset method. A structure of the apparatus corresponding to the method is the same as that in the embodiment corresponding to FIG. 1, and details are not repeated herein.

The method includes:
generating, by a reset switch 10, a low-level reset signal when being pressed, where the reset signal is input into a flip-flop from a data input pin;
receiving, by the D flip-flop 30, an electrical signal from a clock pin, where a rising edge of the electrical signal triggers the flip-flop to latch a low-level state of the reset signal, and outputting, by the D flip-flop 30, a low-level reset request signal from a true flip-flop output pin according to the latched low-level state of the reset signal; and
starting, by a CPU 40, a factory reset operation according to the reset request signal input from a first GPIO pin.

It should be noted that the apparatus may be any device, such as a router or a switch, that needs to implement a factory reset function. Therefore, there may be different quantities of power supply modules inside different devices. For example, there may be only one first power supply module on a board inside a device; and the first power supply module not only needs to provide an electrical signal for the D flip-flop, but also needs to supply working power to the D flip-flop.

There may be multiple power supply modules on a board inside a device. The multiple power supply modules include a first power supply module and further include a second power supply module. The first power supply module provides an electrical signal for the D flip-flop, and the second power supply module may supply working power to the D flip-flop. According to different quantities of power supply modules inside the apparatus, different circuit solutions are designed, and different factory reset methods are provided. Descriptions are separately provided in the following:

1. The Apparatus Includes a First Power Supply Module 20 and a Second Power Supply Module 70.

This application provides an embodiment of a factory reset method. A structure of the apparatus corresponding to the method is the same as that in the embodiment corresponding to FIG. 2, and details are not repeated herein.

The method includes:
generating, by a reset switch 10, a low-level reset signal when being pressed, where the reset signal is input into a D flip-flop 30 from a data input pin;
supplying, by the second power supply module 70 after being powered on, working power supply to the D flip-flop 30, where the second power supply module is powered on earlier than the first power supply module 20; and
outputting, by the first power supply module 20, an electrical signal when being powered on, where the electrical signal is input into the D flip-flop from a CLK pin of the D flip-flop.

A rising edge of the electrical signal triggers the D flip-flop 30 that has entered a working state to latch a low-level state of the reset signal.

The D flip-flop 30 outputs a low-level reset request signal from a Q pin of the D flip-flop 30 according to the latched low-level state of the reset signal. A CPU 40 starts a factory reset operation according to the reset request signal input from a first GPIO pin.

In this embodiment of this application, an implementation in which the apparatus having multiple power supply modules implements a factory reset function is described, to provide pertinent solutions for factory reset function implementation of different types of devices. A circuit is simple, costs of a functional element are low, and production costs of the apparatus are greatly reduced.

2. There is Only One Power Supply Module Inside the Apparatus.

This application provides another embodiment of a factory reset method. A structure of the apparatus corresponding to the method in this embodiment is the same as that in the embodiment corresponding to FIG. 4, and details are not repeated herein.

A reset switch 10 generates a low-level reset signal when being pressed. The reset signal is input into a D flip-flop 30 from a D pin.

After being powered on, a first power supply module 20 supplies working power to the flip-flop by using a power input pin and a ground pin of the flip-flop.

The first power supply module 20 outputs, when being powered on, an original signal to the delay circuit 50. The original signal passes through a delay circuit 50 and is output as an electrical signal.

The electrical signal is input into the D flip-flop 30 from a CLK pin of the D flip-flop, and a rising edge of the electrical signal triggers the D flip-flop 30 to latch a low-level state of the reset signal.

The D flip-flop 30 outputs a low-level reset request signal from a Q pin of the D flip-flop according to the latched low-level state of the reset signal. A CPU 40 starts a factory reset operation according to the reset request signal input from a first GPIO pin.

It should be noted that an objective of performing delay processing on the electrical signal is to ensure that the rising edge of the electrical signal triggers the D flip-flop 30 to work after the D flip-flop 30 has reached a working level of the D flip-flop.

Further, because the electrical signal is obtained after delay processing is performed on the original signal, the rising edge of the electrical signal is slow, and an edge steep circuit 60 may be used to process a second signal, so that steepness of a rising edge of the second signal is increased.

A structure of the apparatus corresponding to the method in this embodiment is the same as that in the embodiment corresponding to FIG. 6, and details are not repeated herein.

A reset switch 10 generates a low-level reset signal when being pressed. The reset signal is input into a D flip-flop 30 from a D pin.

A first power supply module 20 generates an original signal when being powered on. The original signal is transmitted to a delay circuit 50 from a PG pin of the first power supply module 20.

The delay circuit 50 performs delay processing on the original signal. A delay signal output from an output end of the delay circuit 50 passes through the edge steep circuit 60 and is output as an electrical signal, and a rising edge, whose steepness is increased, of the electrical signal triggers the D flip-flop 30 to latch a low-level state of the reset signal.

The D flip-flop 30 outputs a low-level reset request signal from a Q pin according to the latched low-level state of the reset signal. A CPU 40 starts a factory reset operation according to the reset request signal input from a first GPIO pin.

In this embodiment of this application, an implementation in which a device having only one power supply module on a board inside the apparatus implements a factory reset function is described. Delay processing and steep processing are performed on the original signal output by the first power supply module 20, to obtain the electrical signal. The rising edge of the electrical signal triggers the CPU 40 to perform the factory reset function, so that the factory reset function is well implemented and pertinent solutions are provided for factory reset function implementation of different types of apparatuses. Costs of the delay circuit 50 and the edge steep circuit 60 are low, the circuits are simple, and production costs of the apparatus are greatly reduced.

Based on the foregoing embodiments, after the CPU 40 completes the factory reset operation according to the reset request signal that is input from the first GPIO pin, the CPU 40 implements a reset operation of the D flip-flop 30.

A structure of the apparatus corresponding to the method in this embodiment is the same as that in the embodiment corresponding to FIG. 8, and details are not repeated herein.

The method includes:
after the CPU 40 starts the factory reset operation according to the reset request signal, outputting, by the CPU 40, a low-level reset control signal by using a second GPIO pin, where the low-level reset control signal is input into the D flip-flop 30 from a preset /PR pin of the D flip-flop, and a level of a /CLR pin of the D flip-flop 30 is the same as a level of a VCC pin of the D flip-flop 30, that is, a high level; and
performing, by the D flip-flop 30, a reset operation according to the reset control signal.

Further, after performing the factory reset operation, the CPU 40 inputs the low-level signal into the /PR pin of the D flip-flop 30, to reset the D flip-flop 30, so that a high-level signal is output from a Q pin of the D flip-flop 30. If reset occurs in the apparatus, when the apparatus is reset, the second GPIO pin of the CPU may be in a high-impedance state. A level state of the second GPIO pin is undetermined, and a level of the /PR pin connected to the second GPIO pin is also undetermined. The D flip-flop 30 determines, according to the reset control signal input by the CPU 40 into the /PR pin, that the second GPIO is in the high-impedance state, and the D flip-flop 30 pulls the level of the /PR pin up to a power supply level, that is, a level of the VCC, by using a pull-up resistor. That is, the undetermined level state of the /PR pin remains in a high-level state, to ensure that a status of the D flip-flop 30 is not affected by the reset of the apparatus.

It may be clearly understood by persons skilled in the art that, for the purpose of convenient and brief description, for the foregoing methods, refer to a specific working process of the apparatuses in the foregoing apparatus embodiments, and details are not repeated herein.

In conclusion, the foregoing embodiments are merely intended for describing technical solutions of this application, and thus not intended to be limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the scope of technical solutions of the embodiments of this application.

What is claimed is:

1. A factory reset apparatus, comprising a reset switch, a flip-flop, and a processor, wherein the flip-flop comprises a data input pin, a clock pin, and a true flip-flop output pin, wherein
the reset switch is connected to the data input pin;
the true flip-flop output pin is connected to a first general purpose input/output (GPIO) pin of the processor; and, wherein
the reset switch is configured to generate a low-level reset signal when being pressed, wherein the low-level reset signal is input into the flip-flop from the data input pin;
the flip-flop is configured to:
receive an electrical signal from the clock pin, wherein a rising edge of the electrical signal triggers the flip-flop to latch a low-level state of the low-level reset signal; and
output a low-level reset request signal from the true flip-flop output pin according to the latched low-level state of the low-level reset signal; and
the processor is configured to start a factory reset operation according to a reset request signal input from the first GPIO pin when the level state of the reset request signal is low-level.

2. The apparatus according to claim 1, wherein the apparatus further comprises a first power supply module, a power good pin of the first power supply module is connected to the clock pin, a positive electrode of the first power supply module is connected to a power input pin of the flip-flop, and a negative electrode of the first power supply module is connected to a ground pin of the flip-flop;
the first power supply module is configured to supply, after being powered on, working power to the flip-flop; and
the apparatus further comprises a delay circuit; and, wherein
the first power supply module is connected to the clock pin by using the delay circuit; and
an original signal output by the first power supply module when being powered on passes through the delay circuit and is output as the electrical signal.

3. The apparatus according to claim 2, wherein the apparatus further comprises an edge steep circuit, wherein
the delay circuit is connected to the clock pin using the edge steep circuit; and
the original signal output by the first power supply module when being powered on passes through the delay circuit and is output as a delay signal, wherein the delay signal passes through the edge steep circuit and is output as the electrical signal; and, wherein
the edge steep circuit is configured to increase a steepness of a rising edge of the delay signal.

4. The apparatus according to claim 2, wherein the flip-flop further comprises a preset pin, and the preset pin is connected to a second GPIO pin of the processor; and, wherein
the processor is further configured to: after starting the factory reset operation according to the low-level reset request signal, output a reset control signal by using the second GPIO pin, wherein the reset control signal is input into the flip-flop from the preset pin; and
the flip-flop performs a reset operation according to the reset control signal.

5. The apparatus according to claim 4, wherein the reset control signal is a low-level signal, and a low-level reset control signal is input into the flip-flop from the preset pin, so that the true flip-flop output pin of the flip-flop outputs a high-level signal.

6. The apparatus according to claim 4, wherein the flip-flop is further configured to determine, according to the reset control signal input from the preset pin, that the second GPIO pin is in a high-impedance state, so that a level of the preset pin is pulled up to a power supply level by using a pull-up resistor.

7. The apparatus according to claim 4, wherein the flip-flop further comprises a pull-up resistor configured to pull the preset pin to a high-level state when the second GPIO pin is in a high-impedance state.

8. The apparatus according to claim 1, further comprising a first power supply module and a second power supply module, wherein
a power good pin of the first power supply module is connected to the clock pin;
a positive electrode of the second power supply module is connected to a power input pin of the flip-flop, and a negative electrode of the second power supply module is connected to a ground pin of the flip-flop;
the second power supply module supplies, after being powered on, working power to the flip-flop;
the second power supply module is powered on earlier than the first power supply module; and
the first power supply module outputs the electrical signal when being powered on.

9. A factory reset method, wherein the method is applied to a factory reset apparatus, and the factory reset apparatus comprises a reset switch, a flip-flop, and a processor, wherein the flip-flop comprises a data input pin, a clock pin, and a true flip-flop output pin, wherein
the reset switch is connected to the data input pin, and the true flip-flop output pin is connected to a first general purpose input/output (GPIO) pin of the processor; and, wherein the method comprises:
   generating, by the reset switch, a low-level reset signal when being pressed, wherein the low-level reset signal is input into the flip-flop from the data input pin;
   receiving, by the flip-flop, an electrical signal from the clock pin, wherein a rising edge of the electrical signal triggers the flip-flop to latch a low-level state of the low-level reset signal;
   outputting, by the flip-flop, a low-level reset request signal from the true flip-flop output pin according to the latched low-level state of the low-level reset signal; and
   starting, by the processor, a factory reset operation according to a reset request signal input from the first GPIO pin when the level state of the reset request signal is low-level.

10. The method according to claim 9, wherein the factory reset apparatus further comprises a first power supply module and a delay circuit, wherein a power good pin of the first power supply module is connected to the clock pin by using the delay circuit, and a positive electrode of the first power supply module is further connected to a power input pin of the flip-flop, and a negative electrode of the first power supply module is connected to a ground pin of the flip-flop; and, wherein
   before the receiving, by the flip-flop, an electrical signal from the clock pin, the method further comprises:
   supplying, by the first power supply module after being powered on, working power to the flip-flop by using the power input pin and the ground pin of the flip-flop;
   outputting, by the first power supply module when being powered on, an original signal to the delay circuit; and
   performing, by the delay circuit, delay processing on the original signal.

11. The method according to claim 10, wherein the factory reset apparatus further comprises an edge steep circuit, the delay circuit is connected to the clock pin by using the edge steep circuit;
   the method further comprises:
   outputting, by the delay circuit, a delay signal to the edge steep circuit; and
   increasing, by the edge steep circuit, a steepness of a rising edge of the delay signal.

12. The method according to claim 10, wherein the flip-flop further comprises a preset pin, and the preset pin is connected to a second GPIO pin of the processor; and
   the method further comprises:
   after the processor starts the factory reset operation according to the low-level reset request signal, outputting, by the processor, a reset control signal by using the second GPIO pin, wherein the reset control signal is input into the flip-flop from the preset pin; and
   performing, by the flip-flop, a reset operation according to the reset control signal.

13. The method according to claim 12, further comprising:
   pulling the preset pin to a high-level state by using a pull-up resistor when the second GPIO pin is in a high-impedance state.

14. The method according to claim 9, wherein the factory reset apparatus further comprises a first power supply module and a second power supply module, wherein a power good pin of the first power supply module is connected to the clock pin, a positive electrode of the second power supply module is connected to a power input pin of the flip-flop, and a negative electrode of the second power supply module is connected to a ground pin of the flip-flop, and the second power supply module is powered on earlier than the first power supply module; and
   before the receiving, by the flip-flop, an electrical signal from the clock pin, the method further comprises:
   supplying, by the second power supply module after being powered on, working power to the flip-flop; and
   outputting, by the first power supply module, the electrical signal when being powered on.

* * * * *